(12) United States Patent
Tada

(10) Patent No.: US 8,481,375 B2
(45) Date of Patent: Jul. 9, 2013

(54) SEMICONDUCTOR DEVICE AND METHOD FOR PRODUCING THE SAME

(75) Inventor: Kenshi Tada, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 102 days.

(21) Appl. No.: 13/147,347

(22) PCT Filed: Dec. 4, 2009

(86) PCT No.: PCT/JP2009/006638
§ 371 (c)(1),
(2), (4) Date: Aug. 1, 2011

(87) PCT Pub. No.: WO2010/089831
PCT Pub. Date: Aug. 12, 2010

(65) Prior Publication Data
US 2011/0284860 A1    Nov. 24, 2011

(30) Foreign Application Priority Data

Feb. 5, 2009  (JP) ................................ 2009-025084

(51) Int. Cl.
*H01L 21/84*  (2006.01)
*H01L 27/148*  (2006.01)

(52) U.S. Cl.
USPC ........... 438/157; 438/458; 438/459; 438/585; 257/250; 257/E21.568; 257/E21.623

(58) Field of Classification Search
USPC ... 257/250, E21.623, E21.568, 353; 438/585, 438/157, 149, 458, 459
See application file for complete search history.

(56) References Cited

U.S. PATENT DOCUMENTS

| 6,080,610 A  * | 6/2000 | Hashimoto ................... 438/157 |
| 6,191,007 B1* | 2/2001 | Matsui et al. ................. 438/459 |
| 6,342,717 B1* | 1/2002 | Komatsu ....................... 257/347 |
| 2003/0113961 A1* | 6/2003 | Horiuchi et al. .............. 438/157 |
| 2005/0158933 A1* | 7/2005 | Inoh .............................. 438/197 |
| 2007/0063284 A1* | 3/2007 | Kawahara et al. ............ 257/351 |
| 2007/0257301 A1* | 11/2007 | Allibert et al. ................ 257/315 |

FOREIGN PATENT DOCUMENTS

| JP | H10-111520 A | 4/1998 |
| JP | 10-125881 A | 5/1998 |
| JP | H10-293320 A | 11/1998 |
| JP | 2001-28354 A | 1/2001 |
| JP | 2003-270664 A | 9/2003 |

* cited by examiner

*Primary Examiner* — Kimberly Rizkallah
*Assistant Examiner* — Maria Ligai
(74) *Attorney, Agent, or Firm* — Chen Yoshimura LLP

(57) ABSTRACT

A method for producing a semiconductor device includes a step of forming a first insulation film, a step of forming a separation layer in a base layer, a step of forming a light-blocking film on the surface of the first insulation film, a step of forming a second insulation film such that the light-blocking film is covered, a step of affixing the base layer provided with the light-blocking film to a substrate, a step of separating and removing along the separation layer a portion of the base layer affixed to the substrate, and a step of forming a semiconductor layer such that at least a portion thereof overlaps with the light-blocking film.

11 Claims, 6 Drawing Sheets

SEMICONDUCTOR DEVICE AND METHOD FOR PRODUCING THE SAME

TECHNICAL FIELD

The present invention relates to a semiconductor device used, for example, in a liquid crystal display device or the like, and to a method for manufacturing the same.

BACKGROUND ART

For example, a liquid crystal display device includes a thin film transistor (TFT) substrate on which a plurality of TFTs and pixel electrodes connected thereto are arranged in a matrix, an opposite substrate which is disposed facing this TFT substrate and on which a color filter, a common electrode, and the like are formed, and a liquid crystal layer provided between the opposite substrate and the TFT substrate. A backlight which constitutes the light source is provided on the TFT substrate on the side opposite from the liquid crystal layer. A glass substrate is preferably used as the TFT substrate.

A chemical mechanical polishing (CMP) method has been known as a method for flattening the substrate surface. On a large glass substrate, however, it is difficult to flatten the entire surface with a high degree of accuracy using a CMP method. Therefore, an attempt has been made to perform polycrystallization of amorphous silicon or the like formed on the glass substrate by means of laser annealing and to flatten protrusions or the like at the crystal grain boundary.

Furthermore, in order to stabilize the characteristics of the TFTs formed on the glass substrate, blocking light from a backlight by forming a back-gate layer or light-blocking film (Patent Document 1) has been known.

Meanwhile, as shown in FIG. 15, which is a sectional view, Patent Document 2 discloses that a light-blocking film 102 is formed in advance on a transparent support substrate 101, an insulation layer 103 covering the light-blocking film 102 is formed and flattened, and the surface of an embedded oxide film 105 formed on a monocrystalline silicon substrate 104 is affixed to the surface of this insulation layer 103.

Moreover, Patent Document 3 discloses the following. Namely, recessed and protruding portions are formed on the surface of a semiconductor substrate, and after an insulation layer is formed thereon, an opening for forming a back-gate electrode is formed in a specified region of the insulation layer over the protruding portion, and a back-gate insulation film and a conductive material layer are then formed on the entire surface including the interior of the opening, after which a back-gate electrode is formed inside the opening by polishing the conductive material layer. Subsequently, an interlayer film is formed on the entire surface, the semiconductor substrate and a support substrate are affixed together with the interlayer film being interposed, and the semiconductor substrate is polished from the back surface and flattened so as to expose the insulation layer at the bottom of the recessed portion formed in the surface of the semiconductor substrate. By doing so, an attempt was made to produce SOI-type semiconductor devices having a back-gate electrode at a low cost using a substrate affixing method.

RELATED ART DOCUMENTS

Patent Documents

Patent Document 1: Japanese Patent Application Laid-Open Publication No. H10-111520

Patent Document 2: Japanese Patent Application Laid-Open Publication No. H10-293320

Patent Document 3: Japanese Patent Application Laid-Open Publication No. 2001-28354

SUMMARY OF THE INVENTION

Problems to be Solved by the Invention

However, with the aforementioned Patent Document 1, in cases where the light-blocking film is formed on the backlight side of the silicon layer, a step difference formed by this light-blocking film affects the silicon layer, which makes it difficult to perform laser annealing of this silicon layer with a high degree of accuracy. As a result of the flatness of the silicon surface being impaired by this step difference and protrusions or the like at the crystal grain boundary, it is difficult to make the gate insulation film thinner. Therefore, the threshold voltage cannot be controlled with a high degree of accuracy, and the power-supply voltage becomes high. As a result, it becomes difficult to reduce the power consumption of the semiconductor device.

Furthermore, if polycrystallization of the silicon layer is performed by laser annealing, leakage current caused by crystal defects occurring in this silicon layer becomes too great to ignore. This leakage current also becomes a factor for inhibiting the reduction in the power consumption of the semiconductor device.

Moreover, in the aforementioned Patent Document 2, it is necessary to polish the insulation film that covers the light-blocking film by means of a CMP method on the other-side support substrate to which the semiconductor substrate is affixed. But it is extremely difficult to flatten the insulation film with good accuracy using a CMP method over the entire surface of the support substrate that has been increased in size in recent years. In addition, it is difficult to reduce the film thickness with good accuracy by directly polishing the thick semiconductor substrate affixed to the support substrate by means of a CMP method. Furthermore, in cases where the semiconductor layer of a TFT is formed in the form of an island, alignment at the time of affixing this semiconductor layer and a light-blocking film together becomes very difficult.

In addition, in the aforementioned Patent Document 3, an opening for a back-gate electrode is formed, and a back-gate insulation film and a conductive material layer are then formed on the entire surface including the interior of the opening, after which a back-gate electrode is formed inside the opening by polishing the conductive material layer. However, in cases where one side of the back-gate electrode is sufficiently longer than the thickness of the back-gate electrode layer, a similar recessed portion appears in the surface of the back-gate electrode layer, and if a planarization treatment is performed by means of CMP or the like, the back-gate electrode layer also ends up being ground down. As a result, it is very difficult to control the thickness of the back-gate electrode layer.

The present invention was devised in light of such points, and an object thereof is to improve the characteristics of an element having a semiconductor layer as much as possible while forming a light-blocking film that is disposed to face the semiconductor layer.

Means for Solving the Problems

In order to achieve the object described above, a method for producing a semiconductor device according to the present invention includes: a step of forming a first insulation film having a flat surface on the surface of a base layer; a step of forming a separation layer in the interior of the base layer by ion implantation of a separation substance into this base layer; a step of forming a light-blocking film on the surface of the first insulation film; a step of forming a second insulation film having a flat surface on the base layer such that the light-blocking film is covered; a step of affixing the base layer provided with the light-blocking film to a substrate, using the flat surface of the second insulation film; a step of separating and removing along the separation layer a portion of the base layer affixed to the substrate via the second insulation film; and a step of forming a semiconductor layer that constitutes a semiconductor element from the base layer remaining on the substrate such that at least a portion of this semiconductor layer overlaps with the light-blocking film.

It is also possible to include a step which is performed prior to the step of forming the first insulation film and which is for forming a protruding region that will become the semiconductor layer by etching the surface of the base layer on the side on which the first insulation film is to be formed, wherein in the light-blocking film formation step, the light-blocking film is formed so as to overlap with at least a portion of the protruding region.

It is also possible to include a step of forming a gate insulation film on the first insulation film so as to cover the semiconductor layer, and a step of forming a gate electrode on the surface of the gate insulation film so as to overlap with a portion of the semiconductor layer.

The light-blocking film may constitute a back-gate electrode.

The separation substance may be hydrogen or an inert element.

The base layer may be a monocrystalline silicon layer.

The substrate may be a glass substrate.

Furthermore, the semiconductor device according to the present invention includes: a second insulation film formed on a substrate and having a first recessed portion; a light-blocking film formed inside a first recessed portion of the second insulation film and having a surface that constitutes the same plane as the surface of the second insulation film; a first insulation film covering the surfaces of the light-blocking film and the second insulation film; and a semiconductor layer formed on the surface of the first insulation film, at least a portion of which overlaps with the light-blocking film.

The first insulation film may have a second recessed portion in an area overlapping with the light-blocking film, and the semiconductor layer may be formed inside the second recessed portion of the first insulation film and have a surface that constitutes the same plane as the surface of this first insulation film.

The semiconductor device may include: a gate insulation film that covers the surfaces of the semiconductor layer and the first insulation film; and a gate electrode formed on the surface of the gate insulation film so as to overlap with a portion of the semiconductor layer.

The light-blocking film may constitute a back-gate electrode.

The base layer may be a monocrystalline silicon layer.

The substrate may be a glass substrate.

—Operation—

Next, the operation of the present invention will be described.

When the aforementioned semiconductor device is to be produced, a first insulation film having a flat surface is first formed on the surface of a base layer such as a monocrystalline silicon layer, for example. Next, a separation layer is formed in the interior of the base layer by ion implantation of a separation substance, e.g., hydrogen or an inert element, into the base layer. Next, a light-blocking film is formed on the surface of the first insulation film. The light-blocking film may constitute a back-gate electrode.

Next, a second insulation film having a flat surface is formed on the aforementioned base layer so as to cover the light-blocking film. Next, the base layer having the light-blocking film formed thereon is affixed to a substrate, for instance, a glass substrate or the like, using the flat surface of the aforementioned second insulation film. Next, a portion of the base layer affixed to the substrate via the second insulation film is separated and removed along the aforementioned separation layer. Next, a semiconductor layer that constitutes a semiconductor element is formed from the base layer remaining on the substrate such that at least a portion of this semiconductor layer overlaps with the aforementioned light-blocking film.

Furthermore, prior to the step of forming the first insulation film, it is also possible to form a protruding region which will become the aforementioned semiconductor layer by etching the surface of the base layer on the side on which the first insulation film is to be formed. In this case, in the light-blocking film formation step, the light-blocking film is formed so as to overlap with at least a portion of the protruding region.

Moreover, following the formation of the semiconductor layer, a gate insulation film may be formed on the first insulation film so as to cover this semiconductor layer. In this case, a gate electrode is formed on the surface of the gate insulation film so as to overlap with a portion of the semiconductor layer.

Thus, with the aforementioned production method, by using monocrystalline silicon instead of polysilicon as the material for the base layer, it is possible to solve the problems of reducing the thickness of the gate insulation film caused by difficulty in laser annealing and impairment of flatness of the silicon surface due to the step difference from the lower-layer light-blocking film, protrusions at the crystal grain boundary, and the like, and the threshold voltage in the semiconductor layer can be controlled with a high degree of accuracy, which makes it possible to reduce the power consumption of the semiconductor device.

In addition, because the separation substance can be ion implanted into the base layer prior to the formation of the light-blocking film, it is possible to make the ion implantation depth uniform in the base layer and to form the separation layer at a position of a constant depth.

Furthermore, because the light-blocking film is formed in advance on the base layer before affixing this base layer to the substrate, the difficulty in the alignment between the light-blocking film and the semiconductor layer is reduced, thus allowing a desired range of the semiconductor layer to be covered more easily by the light-blocking film. Moreover, the light-blocking layer and back-gate layer are formed on the side of the base layer before affixing to the substrate and are flattened in advance by CMP, so CMP is not used on the substrate after affixing to this substrate, thus facilitating the affixing in the subsequent step.

In addition, because the semiconductor layer can be composed of monocrystalline silicon, it becomes possible to prevent the occurrence of leakage current caused by crystal defects. Therefore, the light-blocking film disposed to face the semiconductor layer can be formed with good accuracy, and the characteristics of an element having this semiconductor layer can be improved significantly.

Effects of the Invention

With the present invention, it is possible to form a light-blocking film disposed to face the semiconductor layer with good accuracy and to significantly improve the characteristics of an element having this semiconductor layer.

DETAILED DESCRIPTION OF EMBODIMENTS

Embodiments of the present invention will be described in detail below with reference to the figures. Note that the present invention is not limited to the following embodiments.

<<Embodiment 1 of the Invention>>

FIGS. 1 to 8 show Embodiment 1 of the present invention.

Figure 1:
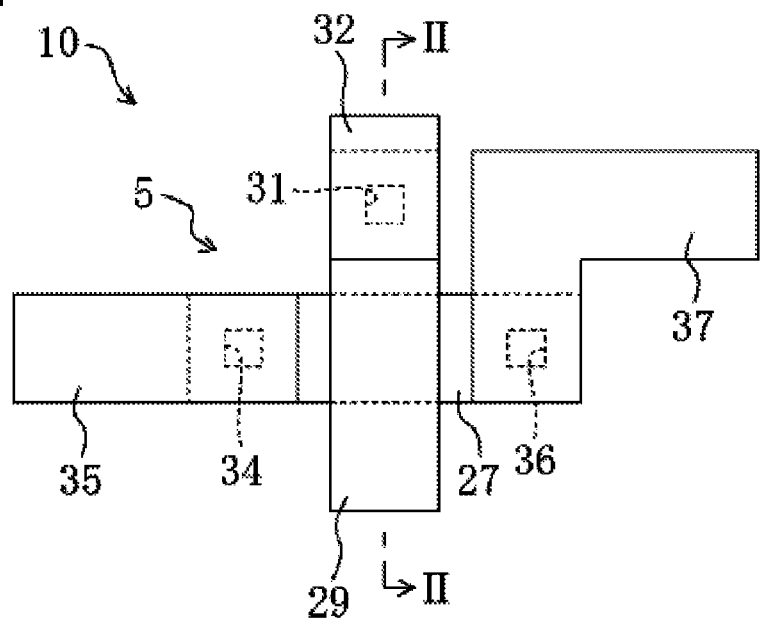
FIG. 1 is a plan view showing main parts of a semiconductor device.
Figure 2:
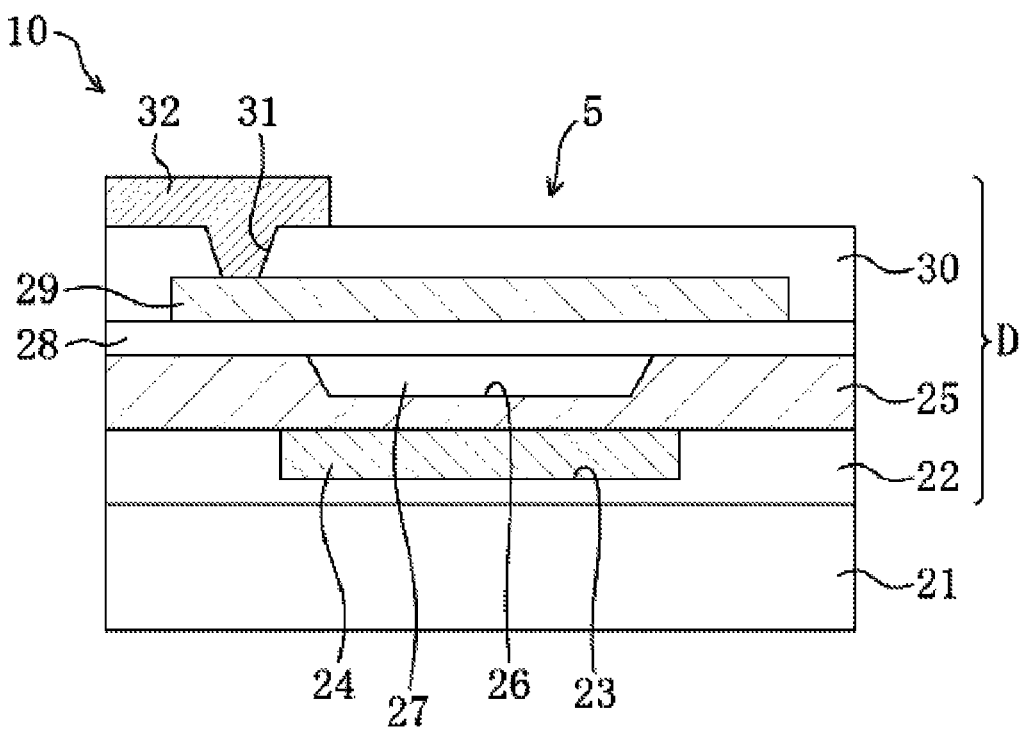
FIG. 2 is a sectional view along the line II-II in FIG. 1.
Figure 8:
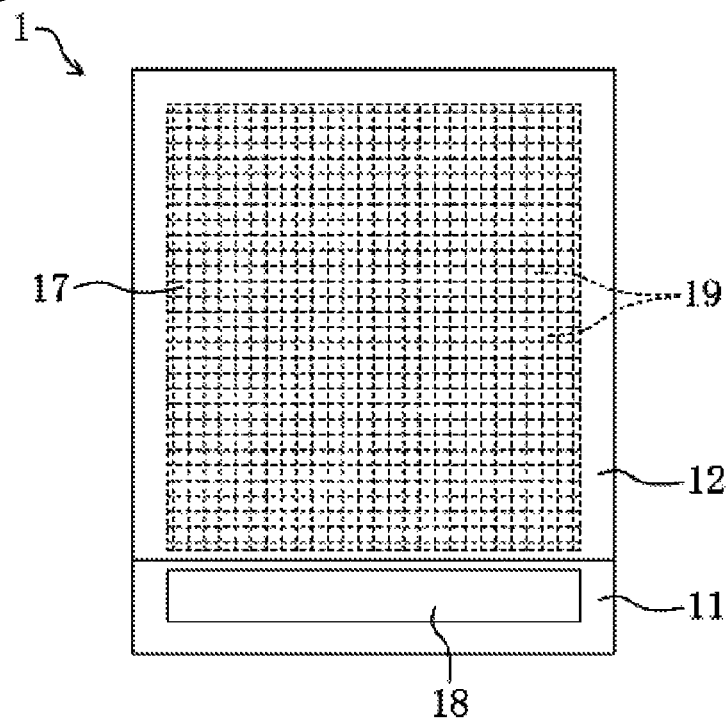
FIG. 8 is a plan view showing main parts of a liquid crystal display device.

FIG. 1 is a plan view showing main parts of a semiconductor device in the present Embodiment 1. FIG. 2 is a sectional view along the line II-II in FIG. 1. FIG. 8 is a plan view showing main parts of a liquid crystal display device.

—Structure of Liquid Crystal Display Device—

As shown in FIG. 8, a liquid crystal display device 1 includes a TFT substrate 11, an opposite substrate 12 disposed facing this TFT substrate 11, and a liquid crystal layer (illustration omitted) provided between the TFT substrate 11 and the opposite substrate 12.

The liquid crystal display device 1 has a display region 17 in an area where the TFT substrate 11 and the opposite substrate 12 overlap with each other. A plurality of pixels 19 are arranged in a matrix in the display region 17.

The TFT substrate 11 is constructed from a glass substrate 21 used as a transparent substrate and has a circuit region 18 in an area where there is no overlapping with the opposite substrate 12. In the circuit region 18, a circuit such as a driver for the drive control of each of the aforementioned pixels is directly fabricated into the glass substrate 21 that constitutes the TFT substrate 11. The driver of this circuit region 18 has a TFT 5 which will be described later.

Furthermore, although illustration is omitted, a TFT as a switching element and a pixel electrode connected thereto are respectively arranged for each pixel on the TFT substrate 11. Gate wiring 32 and source wiring 35 are further connected to each of these TFTs. The end portions of such gate wiring 32 and source wiring 35 are led out to the circuit region 18 and are connected to the aforementioned driver or the like.

The opposite substrate 12, though illustration is omitted, is constructed from a glass substrate used as a transparent substrate, and a color filter, common electrode, and the like are formed thereon on the side of the TFT substrate 11. Meanwhile, a backlight (illustration omitted) that is the light source is provided on a side of the TFT substrate 11, that is opposite from the opposite substrate 12.

—Structure of Semiconductor Device—

A semiconductor device 10 in the present embodiment is used as a multifunction circuit such as a driver formed directly in the glass substrate 21 that constitutes the aforementioned TFT substrate 11. As shown in FIG. 1, the semiconductor device 10 includes the glass substrate 21 and a device part D that is formed on the glass substrate 21 at a high density and with a high degree of accuracy.

Note that a transparent substrate such as the glass substrate 21 is preferable for the substrate 21 when the semiconductor device 10 is applied to a liquid crystal display device that performs transmissive display, but when applied to a display device other than that, other substrates, such as a monocrystalline silicon semiconductor substrate, can be used as the substrate 21.

The device part D has a second insulation film 22 affixed by self-bonding to the glass substrate 21, a TFT 5 which is an element formed on the second insulation film 22, and a light-blocking film 24 disposed between the TFT 5 and the glass substrate 21. That is, the device part D is affixed by self-bonding to the glass substrate 21 via the second insulation film 22. The TFT 5 is constructed, for example, of a PMOS transistor that is a semiconductor element.

Note that a single TFT 5 is shown in FIG. 2, but the device that is formed is not limited to this. An NMOS transistor can, of course, be similarly employed, as well as other elements such as a bipolar transistor or diode. Furthermore, there is no limit on the number thereof; it can be one to several millions.

Here, the structure of the semiconductor device 10 is described in detail with reference to FIGS. 1 and 2.

The second insulation film 22 formed on the surface of the glass substrate 21 has a first recessed portion 23 formed in the surface thereof on the side opposite from the glass substrate 21. The aforementioned light-blocking film 24 is formed inside the first recessed portion 23, and the surface of this light-blocking film 24 constitutes the same plane as the surface of the second insulation film 22.

The light-blocking film 24 is formed from a high-melting-point metal, such as Mo, TiN, or W, for example, and is constructed so as to function as a back-gate electrode as well. Furthermore, it is designed such that the characteristics of the TFT 5 can be varied dynamically by adjusting the potential of the back-gate electrode. Note that it is also possible to provide a back-gate electrode instead of the light-blocking film 24.

The surfaces of the light-blocking film 24 and second insulation film 22 are directly covered by a first insulation film 25. Moreover, a second recessed portion 26 is formed in the surface of the first insulation film 25 on the side opposite from the aforementioned second insulation film 22 in an area overlapping with the light-blocking film 24. A semiconductor layer 27 is formed inside the second recessed portion 26, and the surface of the semiconductor layer 27 constitutes the same plane as the surface of the first insulation film 25. As a result, the semiconductor layer 27 is formed in the form of an island in the surface of the first insulation film 25. The semiconductor layer 27 is formed such that at least a portion thereof overlaps with the light-blocking film 24. In addition, it is sufficient if at least the channel region in the semiconductor layer 27 overlaps with the light-blocking film 24.

In the present embodiment, the semiconductor layer 27 is also referred to as a base layer. A base layer 15 is a layer of semiconductor, for example, monocrystalline silicon semiconductor or the like. Note that besides the monocrystalline silicon semiconductor layer, the base layer 15 can be constructed to contain at least one element selected from a group including group IV semiconductor, group II-VI compound semiconductor, group III-V compound semiconductor, group IV-IV compound semiconductor, mixed crystal semiconductor containing congeners of these, and oxide semiconductor.

As will be described later, a portion of the base layer 15 is separated and removed along a separation layer that is formed by ion implantation of a separation substance such as hydrogen. Then, the thickness of the base layer 15 is reduced as a result of a portion thereof being separated and removed by a heat treatment.

The surfaces of the semiconductor layer 27 and the first insulation film 25 are directly covered by a gate insulation film 28. A gate electrode 29 is formed on the surface of the gate insulation film 28 so as to overlap with a portion of the semiconductor layer 27.

An interlayer insulation film 30 is formed on the gate insulation film 28 so as to cover the gate electrode 29. A contact hole 31 is formed so as to pass through the interlayer insulation film 30 at a position above the gate electrode 29. Furthermore, gate wiring 32 is formed on the surface of the interlayer insulation film 30 and in the interior of the contact hole 31.

Moreover, as shown in FIG. 1 a contact hole 34 is formed so as to pass through the interlayer insulation film 30 and gate insulation film 28 above the source region (illustration omitted) of the semiconductor layer 27, while a contact hole 36 is formed so as to pass through these films above the drain region (illustration omitted). Then, source wiring 35 is connected to the source region of the semiconductor layer 27 via the contact hole 34, while the drain region of the semiconductor layer 27 is connected to drain wiring 37 via the contact hole 36.

—Manufacture Method—

Next, a method for manufacturing the aforementioned semiconductor device 10 will be described with reference to FIGS. 3 to 7.

Figure 3:
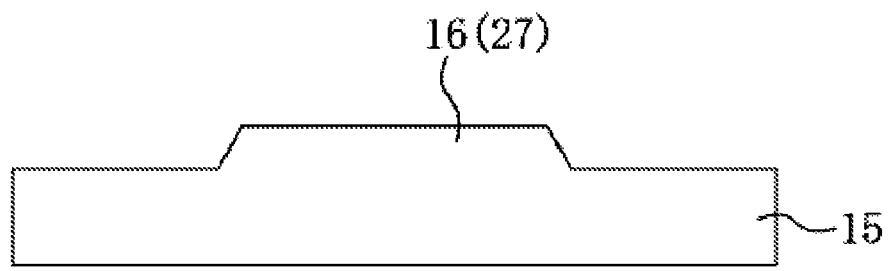
FIG. 3 is a sectional view showing a base layer on which a protruding region is formed.
Figure 4:
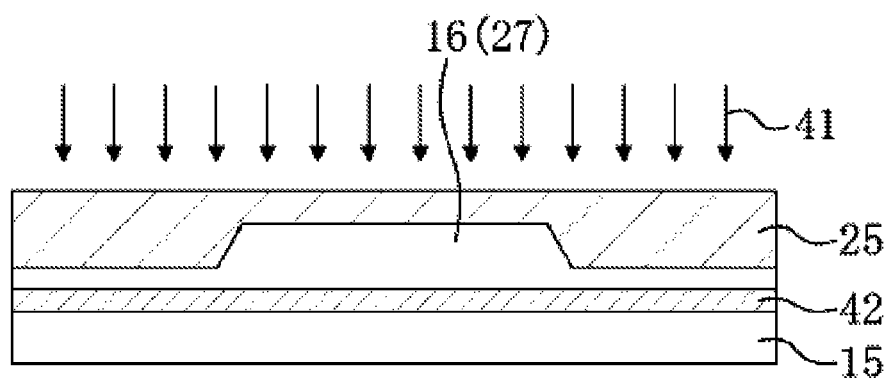
FIG. 4 is a sectional view showing the base layer on which a separation layer is formed.
Figure 5:
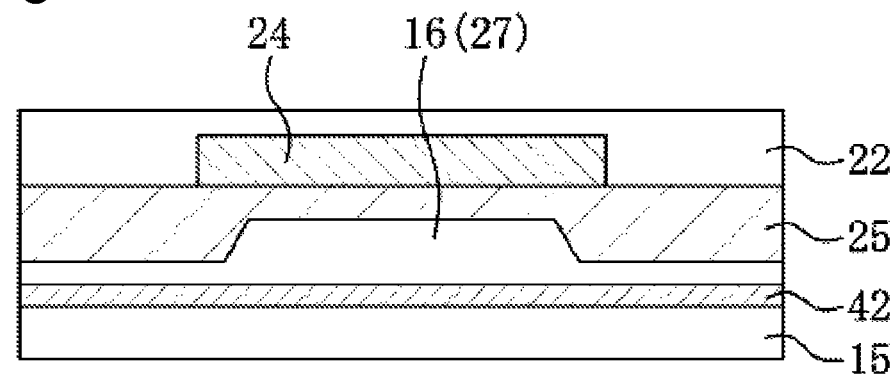
FIG. 5 is a sectional view showing the base layer on which a light-blocking film is formed.
Figure 6:
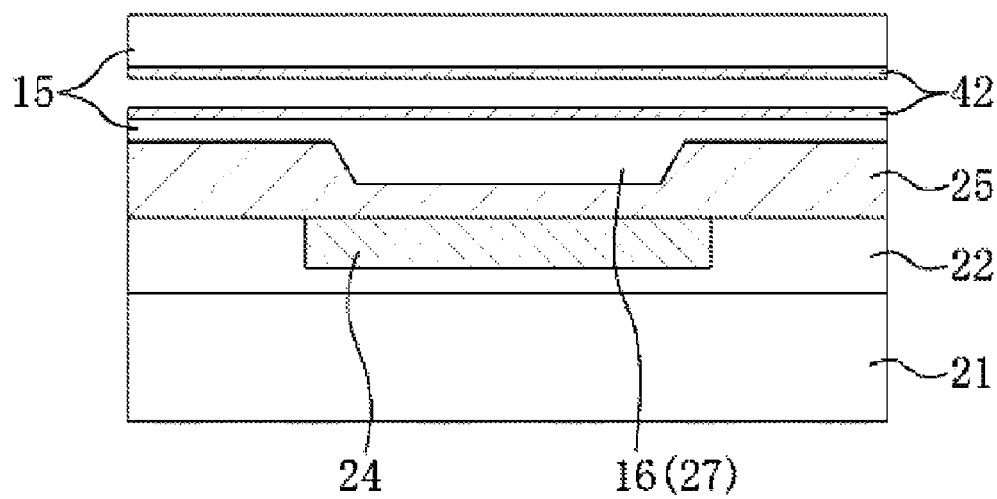
FIG. 6 is a sectional view showing the base layer which is affixed to a glass substrate and from which a portion thereof is separated and removed.
Figure 7:
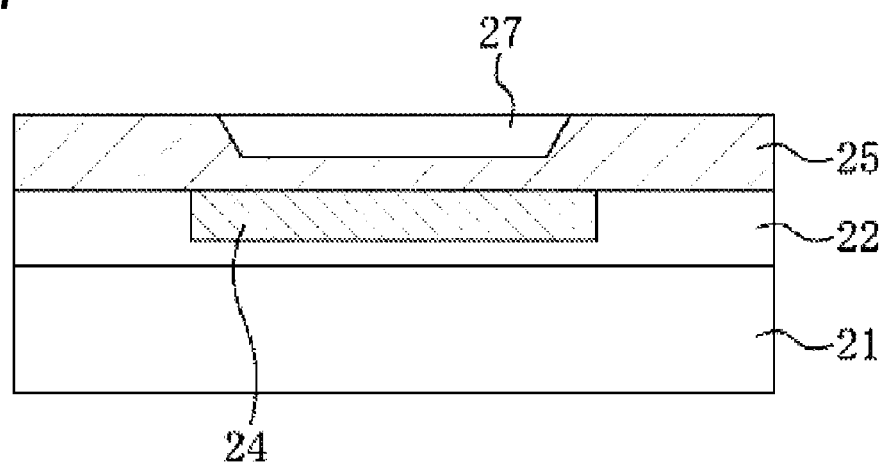
FIG. 7 is a sectional view showing a semiconductor layer formed in a first insulation film.

Here, FIG. 3 is a sectional view showing a base layer 15 on which a protruding region 16 is formed. FIG. 4 is a sectional view showing the base layer 15 on which a separation layer 42 is formed. FIG. 5 is a sectional view showing the base layer 15 on which a light-blocking film 24 is formed. FIG. 6 is a sectional view showing the base layer 15 which is affixed to the glass substrate 21 and from which a portion thereof is separated and removed. FIG. 7 is a sectional view showing the semiconductor layer 27 formed on the first insulation film 25.

(Protruding Region Formation Step)

First, as shown in FIG. 3, a protruding region 16, which will become the semiconductor layer 27, is formed by etching the surface of a silicon wafer 15 that is the base layer 15 on the side on which the first insulation film 25 is to be formed. Here, the base layer 15 is a monocrystalline silicon layer.

(First Insulation Film Formation Step)

Next, as shown in FIG. 4, the first insulation film 25 having a flat surface is formed on the surface of the base layer 15. Specifically, an insulation film is formed so as to cover the protruding region 16, after which the surface of this insulation film is flattened by CMP or like method.

(Separation Layer Formation Step)

Next, as shown in FIG. 4, ion implantation of a separation substance 41 is performed into the base layer 15 on which the first insulation film 25 is formed, thus forming the separation layer 42 in the interior of this base layer 15. Hydrogen is used as the separation substance 41. Note that an inert element such as He and Ne can be used in place of hydrogen. Furthermore, it is also possible to use hydrogen and an inert element. In the present embodiment, because the surface of the first insulation film 25 is flattened, the separation layer 42 can be formed substantially at a constant depth in the interior of the base layer 15.

(Light-Blocking Film Formation Step)

Next, as shown in FIG. 5, the light-blocking film 24 is formed on the surface of the first insulation film 25. Specifically, a high-melting-point metal layer of Mo, TiN, W, or the like, for example, is formed on the surface of the first insulation film 25, and this metal layer is then etched by photolithography to form the light-blocking film 24. In this step, the light-blocking film 24 is formed so as to overlap with at least a portion of the aforementioned protruding region 16.

(Second Insulation Film Formation Step)

Next, as shown in FIG. 5, the second insulation film 22 having a flat surface is formed on the base layer 15 so as to cover the light-blocking film 24. Specifically, an insulation film is formed so as to cover the light-blocking film 24, and the surface of this insulation film is then flattened by CMP or like method.

(Affixing Step)

Next, as shown in FIG. 6, the base layer 15 on which a portion of the device part D is formed as a result of the light-blocking film 24 being provided is affixed to the glass substrate 21, using the flat surface of the second insulation film 22. At this point, the surface of the second insulation film 22 is affixed to the surface of the glass substrate 21 by self-bonding due to van der Waals forces.

(Separation Step)

Next, as shown in FIG. 6, a portion of the base layer 15 that is affixed to the glass substrate 21 is separated and removed along the separation layer 42. Specifically, by heating the base layer 15 that is affixed to the glass substrate 21 via the second insulation film 22 to approximately 400 to 600° C., a portion of the base layer 15 on the side opposite from the glass substrate 21 with the separation layer 42 being interposed is separated and removed along the separation layer 42.

(Semiconductor Layer Formation Step)

Next, as shown in FIGS. 6 and 7, the base layer 15 remaining on the glass substrate 21 is etched using the first insulation film 25 surrounding the protruding region 16 as the etching stopper, thus forming the semiconductor layer 27 constituting the TFT 5 as the semiconductor element. Here, this formation is performed such that at least a portion of the semiconductor layer 27 overlaps with the light-blocking film 24. As a result, only the portion of the base layer 15 that was the protruding region 16 remains in the form of an island and becomes the semiconductor layer 27.

(Gate Insulation Film Formation Step)

Next, as shown in FIG. 2, the gate insulation film 28 is formed on the first insulation film 25 so as to cover the semiconductor layer 27. The surface of the gate insulation film 28 is formed to be flat, conforming to the surfaces of the semiconductor layer 27 and first insulation film 25.

(Gate Electrode Formation Step)

Next, as shown in FIGS. 1 and 2, the gate electrode 29 is formed on the surface of the gate insulation film 28 so as to overlap with a portion of the semiconductor layer 27.

Afterwards, contact holes 31, 34, and 36 are formed in the interlayer insulation film 30 or the like. Subsequently, a metal layer formed on the interlayer insulation film 30 is patterned by photolithography, thus respectively forming gate wiring 32, source wiring 35, and drain wiring 37. Each of the steps above is performed to complete a semiconductor device 10.

—Effect of Embodiment 1—

Thus, in this Embodiment 1, the separation substance 41 can first be ion implanted into the base layer 15 prior to the formation of the light-blocking film 24 as shown in FIGS. 4 and 5, so the depth of the ion implantation can be made uniform in the base layer 15, thus allowing the separation layer 42 to be formed at a position of a constant depth.

Furthermore, it is designed such that the light-blocking film 24 is formed in advance on the base layer 15 before affixing this base layer 15 to the glass substrate 21. Therefore, in addition to eliminating any need for highly precise alignment between the light-blocking film 24 and the semiconductor layer 27 during the affixing step, it is possible to cover a desired region of the semiconductor layer 27 more easily with the light-blocking film 24. Moreover, there is no need to perform a CMP treatment in the glass substrate 21.

In addition, by virtue of the affixing, the semiconductor layer 27 can also easily be formed to be flat. Furthermore, because the semiconductor layer 27 is not formed with a step difference, the gate insulation film 28 can be made thinner easily. As a result, the threshold voltage in the semiconductor layer 27 can be controlled with a high degree of accuracy, which makes it possible to reduce power consumption of the semiconductor device 10.

Moreover, when forming the island-form semiconductor layer 27, the first insulation film 25 can be utilized as the etching stopper, so the thickness of the semiconductor layer 27 can be controlled with a high degree of accuracy.

In addition, because the semiconductor layer 27 is constructed of monocrystalline silicon, it is possible to prevent the occurrence of leakage current caused by crystal defects. As a result, the light-blocking film 24 that is disposed facing the semiconductor layer 27 can be formed with high accuracy, and this also enables significant improvement of the characteristics of the TFT 5 having this semiconductor layer 27.

<<Embodiment 2 of the Invention>>

FIGS. 9 to 14 show Embodiment 2 of the present invention.

Figure 9:
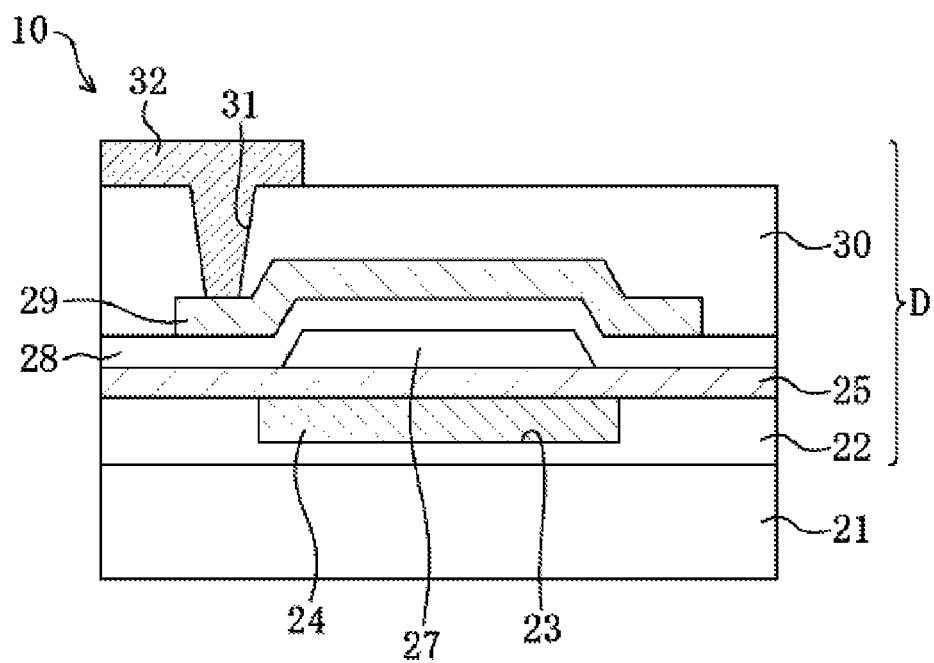
FIG. 9 is a sectional view showing main parts of a semiconductor device in the present Embodiment 2.

FIG. 9 is a sectional view showing main parts of the semiconductor device of the present Embodiment 2. Note that in each of the following embodiments, the same reference characters are assigned to the parts that are the same as in FIGS. 1 to 8, and a detailed description thereof will be omitted.

In the aforementioned Embodiment 1, the semiconductor layer 27 is formed inside the second recessed portion 26 formed in the first insulation film 25. In the present Embodiment 2, in contrast, the semiconductor layer 27 is formed on the surface of the flat first insulation film 25.

—Structure of Semiconductor Device—

As in the aforementioned Embodiment 1, the semiconductor device 10 is such that the light-blocking film 24 is formed inside the first recessed portion 23 formed in the second insulation film 22, and the surface of this light-blocking film 24 constitutes the same plane as the surface of the surrounding second insulation film 22.

In contrast to the aforementioned Embodiment 1, the surface of the first insulation film 25 provided on the surfaces of the light-blocking film 24 and second insulation film 22 is formed to be flat. Then, the semiconductor layer 27 is formed in the form of an island on the surface of this flat first insulation film 25. The surface of the gate insulation film 28 that covers this semiconductor layer 27 is formed in a convex shape in an area where the semiconductor layer 27 is covered. Furthermore, the surface of the gate electrode 29 that covers this gate insulation film 28 is also formed in a convex shape, conforming to the gate insulation film 28.

The interlayer insulation film 30, contact holes 31, 34, and 36, gate wiring 32, source wiring 35, and drain wiring 37 are formed in the same manner as in the aforementioned Embodiment 1.

—Manufacture Method—

Next, a method for manufacturing the aforementioned semiconductor device 10 will be described with reference to FIGS. 10 to 14.

Figure 10:
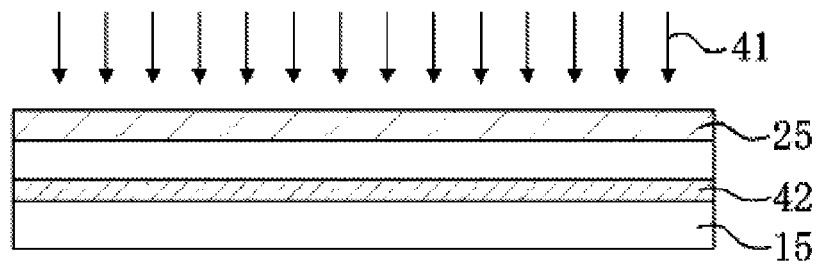
FIG. 10 is a sectional view showing the base layer on which a separation layer is formed.
Figure 11:
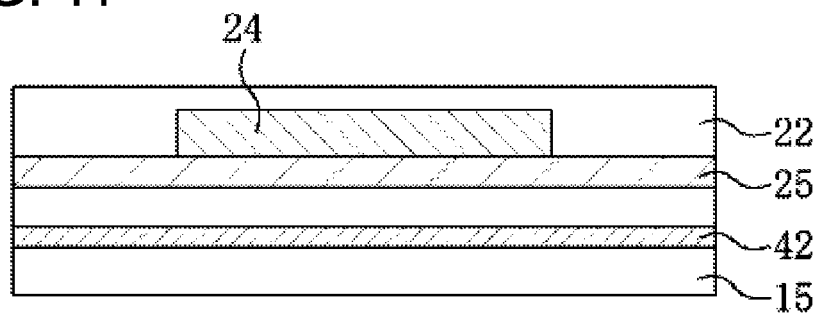
FIG. 11 is a sectional view showing the base layer on which a light-blocking film is formed.
Figure 12:
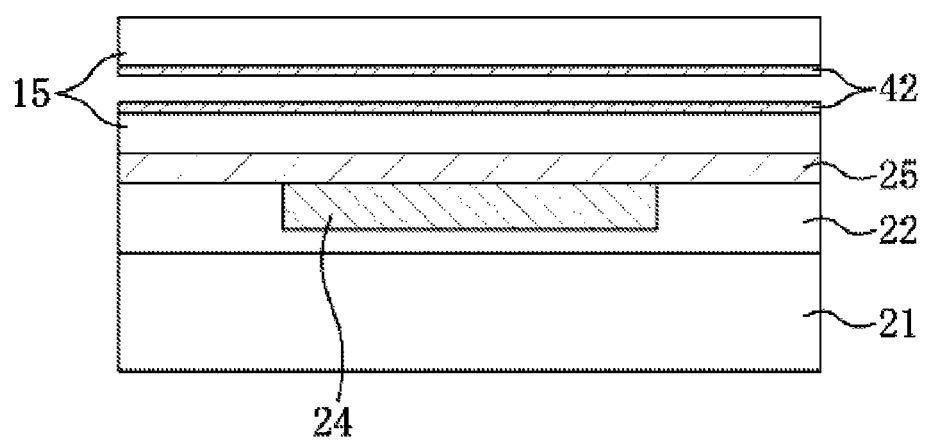
FIG. 12 is a sectional view showing the base layer which is affixed to a glass substrate and from which a portion thereof is separated and removed.
Figure 13:
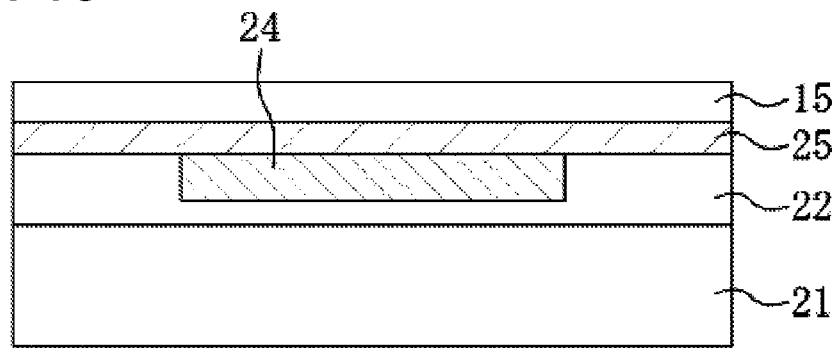
FIG. 13 is a sectional view showing the base layer whose film thickness is reduced above a first insulation film.
Figure 14:
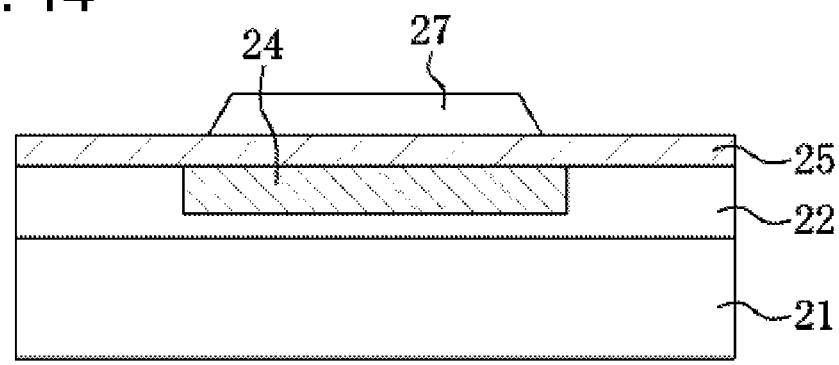
FIG. 14 is a sectional view showing a semiconductor layer formed on the first insulation film.
Figure 15:
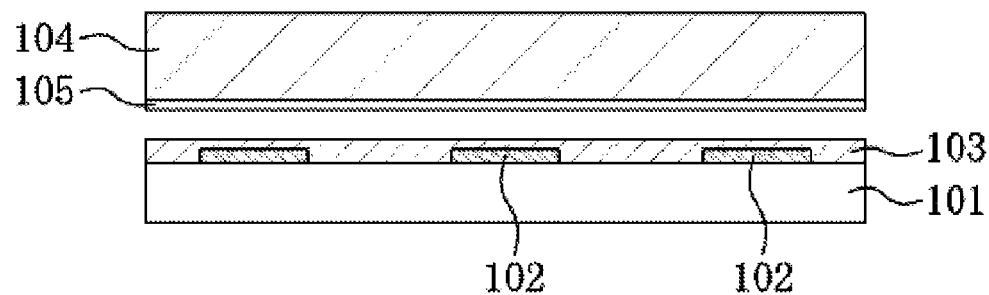
FIG. 15 is a sectional view showing a silicon substrate and an embedded oxide film affixed to a support substrate on which a conventional light-blocking film is formed.

FIG. 10 is a sectional view showing the base layer on which the separation layer is formed. FIG. 11 is a sectional view showing the base layer on which the light-blocking film is formed. FIG. 12 is a sectional view showing the base layer which is affixed to the glass substrate and from which a portion thereof is separated and removed. FIG. 13 is a sectional view showing the base layer whose film thickness is reduced above the first insulation film. FIG. 14 is a sectional view showing the semiconductor layer formed on the first insulation film.

(First Insulation Film Formation Step)

First, as shown in FIG. 10, the first insulation film 25 is formed on the surface of a silicon wafer that is the base layer 15. Because the surface of the base layer 15 is flat, the surface of the first insulation film 25 is also formed to be flat.

(Separation Layer Formation Step)

Next, as shown in FIG. 10, the separation layer 42 is formed by ion implanting a separation substance 41 into the base layer 15 on which the first insulation film 25 is formed. Hydrogen or an inert element (He, Ne, or the like) is used as the separation substance 41 as in the aforementioned Embodiment 1. Because the surface of the first insulation film 25 is flat, the separation layer 42 can be formed substantially at a constant depth in the interior of the base layer 15.

(Light-Blocking Film Formation Step)

Next, as shown in FIG. 11, the light-blocking film 24 is formed on the surface of the first insulation film 25. Specifically, a high-melting-point metal layer of Mo, TiN, W, or the like, for instance, is formed on the surface of the first insulation film 25, and this metal layer is then etched by photolithography to form the light-blocking film 24.

(Second Insulation Film Formation Step)

Next, as shown in FIG. 11, the second insulation film 22 having a flat surface is formed on the base layer 15 so as to cover the light-blocking film 24. The second insulation film 22 is formed by flattening by means of CMP or like method the surface of an insulation film that is formed so as to cover the light-blocking film 24.

(Affixing Step)

Next, as shown in FIG. 12, the base layer 15 provided with the light-blocking film 24 is affixed to the glass substrate 21, using the flat surface of the second insulation film 22. At this point, the surface of the second insulation film 22 is affixed to the surface of the glass substrate 21 by self-bonding due to van der Waals forces.

(Separation Step)

Next, as shown in FIG. 12, a portion of the base layer 15 that is affixed to the glass substrate 21 is separated and removed along the separation layer 42. Specifically, by heating the base layer 15 that is affixed to the glass substrate 21 to approximately 400 to 600° C., a portion of the base layer 15 on the side opposite from the glass substrate 21 with the separation layer 42 being interposed is separated and removed along the separation layer 42.

(Semiconductor Layer Formation Step)

Next, as shown in FIG. 13, the thickness of the base layer 15 is reduced to a desired thickness by etching, and the base layer 15 is then patterned by photolithography or the like in the form of an island, thus forming the semiconductor layer 27.

(Gate Insulation Film Formation Step)

Next, as shown in FIG. 9, the gate insulation film 28 is formed so as to cover the semiconductor layer 27. The surface of the gate insulation film 28 is formed in a convex shape, conforming to the surface of the semiconductor layer 27.

(Gate Electrode Formation Step)

Next, as shown in FIG. 9, the gate electrode 29 is formed on the surface of the gate insulation film 28 so as to overlap with a portion of the semiconductor layer 27. Afterwards, contact holes 31, 34, and 36 are formed in the interlayer insulation film 30 or the like in the same manner as in the aforementioned Embodiment 1, thus respectively forming the gate wiring 32, source wiring 35, and drain wiring 37. Each of the steps above is performed to complete a semiconductor device 10.

—Effect of Embodiment 2—

In this Embodiment 2, as in the aforementioned Embodiment 1, it is designed such that the light-blocking film 24 is formed in advance on the base layer 15 before affixing this base layer 15 to the glass substrate 21. Therefore, in addition to eliminating any need for highly precise alignment between the light-blocking film 24 and the semiconductor layer 27 during the affixing step, it is possible to cover a desired region of the semiconductor layer 27 more easily with the light-blocking film 24. Moreover, the separation layer 42 can be formed at a position of a constant depth of the base layer, and there is no need to perform a CMP treatment in the glass substrate 21.

In addition, by virtue of the affixing, the semiconductor layer 27 can also be formed to be flat easily, so the threshold voltage in the semiconductor layer 27 can be controlled with a high degree of accuracy. Furthermore, because the semiconductor layer 27 is constructed of monocrystalline silicon, it is possible to prevent the occurrence of leakage current caused by crystal defects. As a result, the light-blocking film 24 that is disposed to face the semiconductor layer 27 can be formed with good accuracy, and the characteristics of the TFT 5 having the semiconductor layer 27 can be improved significantly.

INDUSTRIAL APPLICABILITY

As described above, the present invention is useful for a semiconductor device used, for example, in a liquid crystal display device or the like and for a method for producing the same.

DESCRIPTION OF REFERENCE CHARACTERS

5 TFT (semiconductor element)
10 semiconductor device
15 base layer, silicon wafer
16 protruding region
21 glass substrate (substrate)
22 second insulation film
23 first recessed portion
24 light-blocking film, back-gate electrode
25 first insulation film
26 second recessed portion
27 semiconductor layer
28 gate insulation film
29 gate electrode
41 separation substance
42 separation layer

The invention claimed is:

1. A method for producing a semiconductor device, comprising:
    forming a protruding region by etching a top surface of a base layer;
    forming a first insulation film having a flat surface on its entirety on a surface of the base layer having the protruding region therein;
    forming a separation layer in an interior of said base layer by ion implantation of a separation substance into the base layer;
    forming a light-blocking film on a surface of said first insulation film such that said light-blocking film overlaps with at least a portion of said protruding region;
    forming a second insulation film having a flat surface in its entirety over said base layer such that said light-blocking film is covered;
    affixing the base layer provided with said light-blocking film to a substrate, using the flat surface of said second insulation film;
    separating and removing along said separation layer a portion of the base layer affixed to said substrate via said second insulation film; and
    etching the base layer remaining over said substrate until the first insulation film is exposed except where the protruding region of the base layer is present so as to form a semiconductor layer that constitutes a semiconductor element from the base layer remaining over said substrate such that at least a portion of the semiconductor layer overlaps with said light-blocking film.

2. The method for producing a semiconductor device according to claim 1, further comprising:
    forming a gate insulation film on said first insulation film so as to cover said semiconductor layer; and
    forming a gate electrode on a surface of said gate insulation film so as to overlap with a portion of said semiconductor layer.

3. The method for producing a semiconductor device according to claim 1, wherein said light-blocking film constitutes a back-gate electrode.

4. The method for producing a semiconductor device according to claim 1, wherein said separation substance is hydrogen or an inert element.

5. The method for producing a semiconductor device according to claim 1, wherein said base layer is a monocrystalline silicon layer.

6. The method for producing a semiconductor device according to claim 1, wherein said substrate is a glass substrate.

7. A semiconductor device comprising:
    a second insulation film formed on a substrate and having a first recessed portion;
    a light-blocking film formed inside the first recessed portion of said second insulation film wherein an entire surface of the light-blocking film lies in a same plane as a surface of the second insulation film;
    a first insulation film covering surfaces of said light-blocking film and said second insulation film, said first insulation film having a second recessed portion in an area overlapping with said light-blocking film and having substantially flat surface elsewhere; and a semiconductor layer formed on a surface of said first insulation film, at least a portion of the semiconductor layer overlapping with said light-blocking film, wherein said semiconductor layer is formed inside the second recessed portion of said first insulation film, and an entire surface of the said semiconductor layer lies in a same plane as a surface of this first insulation film.

8. The semiconductor device according to claim 7, further comprising:
a gate insulation film that covers the surfaces of said semiconductor layer and said first insulation film; and
a gate electrode formed on a surface of said gate insulation film so as to overlap with a portion of said semiconductor layer.

9. The semiconductor device according to claim 7, wherein said light-blocking film constitutes a back-gate electrode.

10. The semiconductor device according to claim 7, wherein said semiconductor layer is a monocrystalline silicon layer.

11. The semiconductor device according to claim 7, wherein said substrate is a glass substrate.

* * * * *